United States Patent
Policandriotes et al.

(10) Patent No.: US 9,938,618 B2
(45) Date of Patent: Apr. 10, 2018

(54) METHOD FOR RAPID AND EFFICIENT CHEMICAL VAPOR INFILTRATION AND DENSIFICATION OF CARBON FIBER PREFORMS, POROUS SUBSTRATES AND CLOSE PACKED PARTICULATES

(71) Applicant: GOODRICH CORPORATION, Charlotte, NC (US)

(72) Inventors: Tod J. Policandriotes, Carbondale, IL (US); Jarlen Don, Carbondale, IL (US)

(73) Assignee: GOODRICH CORPORATION, Charlotte, NC (US)

( * ) Notice: Subject to any disclaimer, the term of this patent is extended or adjusted under 35 U.S.C. 154(b) by 0 days.

(21) Appl. No.: 15/078,882

(22) Filed: Mar. 23, 2016

(65) Prior Publication Data

US 2016/0281218 A1 Sep. 29, 2016

Related U.S. Application Data

(60) Provisional application No. 62/137,214, filed on Mar. 23, 2015.

(51) Int. Cl.
| | |
|---|---|
| *C23C 16/26* | (2006.01) |
| *C23C 16/48* | (2006.01) |
| *C23C 16/455* | (2006.01) |
| *C23C 16/44* | (2006.01) |
| *C04B 35/83* | (2006.01) |
| *C23C 16/04* | (2006.01) |

(52) U.S. Cl.
CPC .............. *C23C 16/26* (2013.01); *C04B 35/83* (2013.01); *C23C 16/045* (2013.01); *C23C 16/4412* (2013.01); *C23C 16/45593* (2013.01); *C04B 2235/614* (2013.01)

(58) Field of Classification Search
CPC ..... C23C 16/26; C23C 16/32; C23C 16/4412; C23C 16/45593; C23C 16/48; C23C 14/325
See application file for complete search history.

(56) References Cited

U.S. PATENT DOCUMENTS

| | | | |
|---|---|---|---|
| 6,432,538 B1 * | 8/2002 | Hiraoka ................. | C30B 15/10 264/29.5 |
| 2004/0071877 A1 * | 4/2004 | Goujard .............. | C04B 41/4531 427/255.28 |
| 2006/0151912 A1 * | 7/2006 | Bauer ................. | C04B 35/6269 264/257 |
| 2007/0184179 A1 * | 8/2007 | Waghray ................. | C23C 16/52 427/8 |
| 2008/0160192 A1 * | 7/2008 | Thebault ............... | C23C 16/045 427/249.2 |

(Continued)

OTHER PUBLICATIONS

Jeong, Hyeok Je, et al., "Densification of Carbon/Carbon Composites by Pulse Chemical Vapor Infiltration". Carbon vol. 34, No. 3, pp. 417-421, 1996.*

(Continued)

*Primary Examiner* — Bret P Chen
(74) *Attorney, Agent, or Firm* — Snell & Wilmer, L.L.P.

(57) ABSTRACT

A novel new method for rapidly and efficiently depositing carbon on and within or densifying carbon fiber preforms, porous substrates and close packed particulates by pyrolitic carbon in the structures of isotropic, anisotropic, graphitic, amorphous, lonsdaleite, and diamond.

12 Claims, 2 Drawing Sheets

(56) References Cited

U.S. PATENT DOCUMENTS

Figure 1:
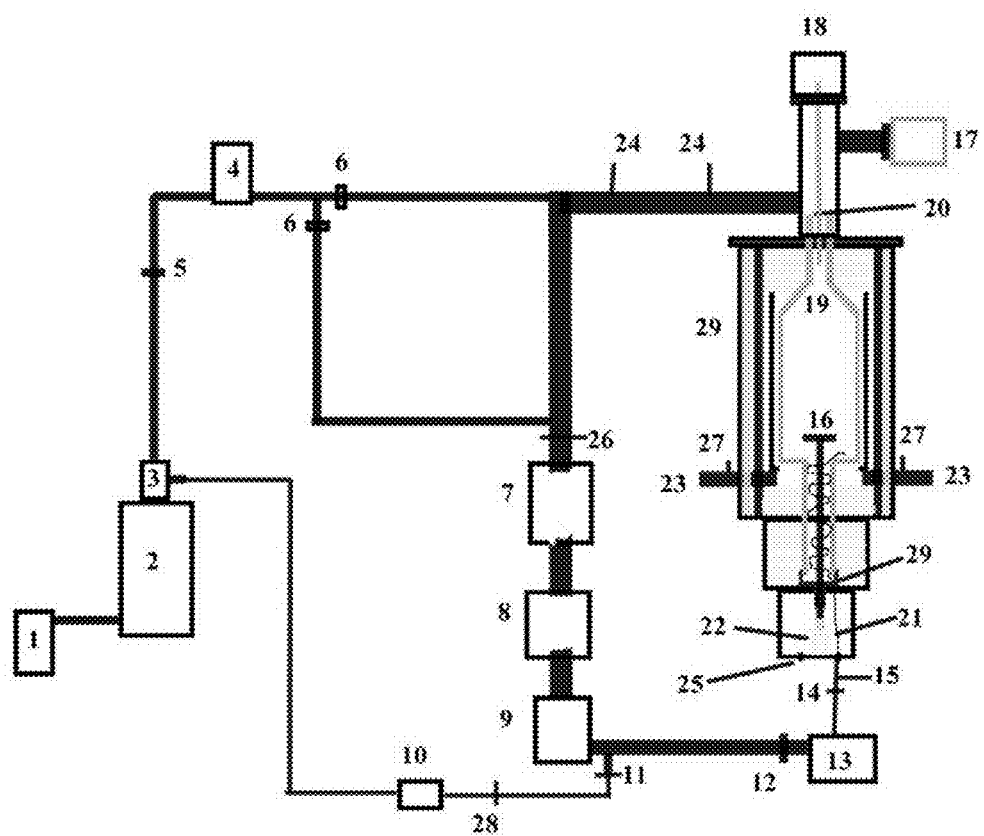

| | | | | |
|---|---|---|---|---|
| 2009/0238966 A1* | 9/2009 | La Forest | ............... | C04B 35/83 427/228 |
| 2010/0126350 A1* | 5/2010 | Sharma | ............... | B01D 29/904 95/268 |
| 2011/0249803 A1* | 10/2011 | Drory | ................... | H01J 35/108 378/125 |

OTHER PUBLICATIONS

Gupte, S.M., et al., "Densification of Porous Materials by Chemical Vapor Infiltration". J. Electrochem. Soc., vol. 136, No. 2, Feb. 1989, pp. 555-561.*

Kawase, Kazumasa, et al., "Densification of Chemical Vapor Deposition Silicon Dioxide Film Using Ozone Treatment". Japanese Journal of Applied Physics 48 (2009) 101401, pp. 1-7.*

Chen, Jian-xun, et al., "Densification mehcnaism of chemical vapor infiltration technology for carbon/carbon composites". Trans. Nonferrous Met. Soc. China 17(2007) 519-522.*

* cited by examiner

METHOD FOR RAPID AND EFFICIENT CHEMICAL VAPOR INFILTRATION AND DENSIFICATION OF CARBON FIBER PREFORMS, POROUS SUBSTRATES AND CLOSE PACKED PARTICULATES

CROSS-REFERENCED APPLICATION

This application claims priority to U.S. Provisional application Ser. No. 62/137,214 filed on Mar. 23, 2015. The disclosure of the above-referenced application is incorporated herein by reference in its entirety.

FIELD

The present disclosure relates to chemical vapor infiltration and densification of carbon fiber preforms, porous substrates and close packed particulates.

BACKGROUND

This section provides background information related to the present disclosure which is not necessarily prior art.

Typical industrial chemical vapor infiltration systems are approximately 5-6% efficient in their use of the carbon in the hydrocarbon gasses being used. Even with currently patented methods and devices for chemical vapor infiltration, the efficiency is low in the range of 10%. Current recycling methods do not utilize the heavy hydrocarbons and reprocess them. The time to make carbon-carbon composites and thick films (>200 microns) is very long on the order of 1000-2000 hours to density from 0.4 g/cc to >1.75 g/cc.

SUMMARY

This section provides a general summary of the disclosure, and is not a comprehensive disclosure of its full scope or all of its features.

A preferred embodiment of this invention provides a method of chemical vapor densification of a base material. Generally the method comprises loading the base material into the chamber of a substantially fluid tight oven. A sub-atmospheric pressure inert gas atmosphere is established in the chamber. Preferably the pressure is 100 Torr or less. A hydrocarbon reaction gas is introduced into the chamber to infiltrate and density the base material. This gas can include any suitable hydrocarbon, but in the preferred embodiment comprises at least one of methane, propane, and natural gas. The unreacted hydrocarbon reaction gas is withdrawn from the chamber, and at least some of the withdrawn unreacted hydrocarbon reaction gas is recirculated back into the chamber.

In some preferred embodiments, the method includes electrically isolating the base material in the chamber, and applying an electrical voltage to the base material while the hydrocarbon reaction gas is circulating in the chamber. The electrical voltage can be fixed, or it can be time-varying.

The hydrocarbon reaction gas comprises at least one of methane, propane, or natural gas, and optionally hydrogen.

An electric arc can be applied to the unreacted hydrocarbon reaction gas withdrawn from the chamber to breakdown the hydrocarbons of the hydrocarbon reaction gas. The step of withdrawing unreacted hydrocarbon reaction gas from the chamber can comprise separating the gases with a venturi, and recirculating only part of the withdrawn unreacted hydrocarbon reaction gas back into the chamber.

The pressure in the chamber is preferably maintained at a pressure of about 100 Torr or less.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 2A:
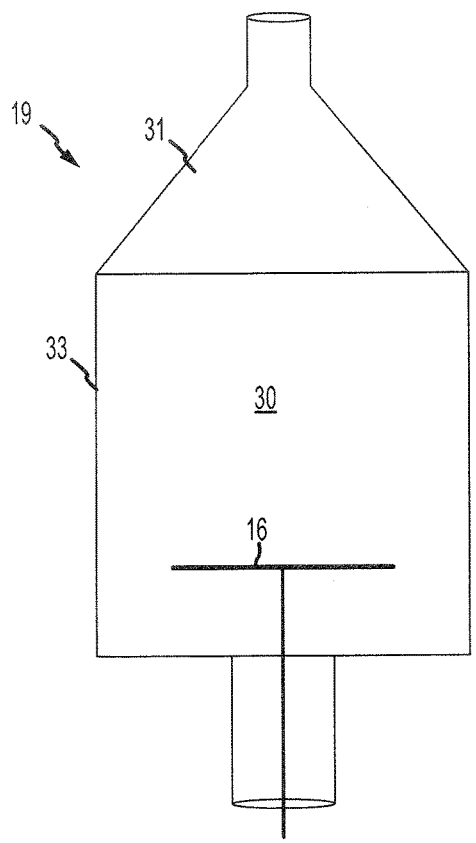
Figure 2B:
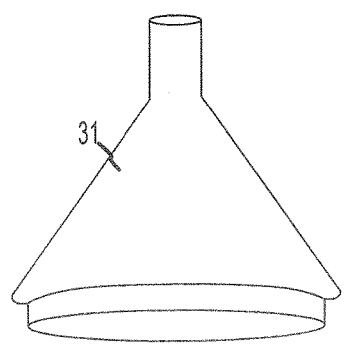

FIG. 1 is a schematic diagram of a preferred embodiment of a system for chemical vapor infiltration and densification, in accordance with the principles of this invention; and FIGS. 2A and 2B illustrate Venturi cone and retort, in accordance with the principles of this invention.

Corresponding reference numerals indicate corresponding parts throughout the several views of the drawings.

DETAILED DESCRIPTION

Example embodiments will now be described more fully with reference to the accompanying drawings.

Embodiments of this invention provide a novel method for rapidly and efficiently depositing carbon on and within or densifying carbon fiber preforms, porous substrates and close packed particulates by pyrolitic carbon in the structures of isotropic, anisotropic, graphitic, amorphous, lonsdaleite, and diamond. The preforms, substrates and/or close packed particulates are placed into a vacuum-tight oven/furnace as a shape, form or mold and electrically isolated from the surrounding system. The oven/furnace is then evacuated to remove atmospheric gases. The samples can be grounded, charged with a positive or negative dc voltage, or frequency oscillated using an ac voltage (that can be biased positively or negatively) independent of the whole system. The interior walls of the reaction chamber/retort are either grounded or electrically isolated from the surrounding system. The oven/furnace is brought to an isothermal or gradient temperature condition above room temperature in a vacuum with or without an inert gas. Once the setpoint temperature and pressure are achieved and controlled, one or more dry recycling/re-circulating pumps are activated in a circuit from the oven's exhaust to the oven's input. One or more hydrocarbon reaction gases and/or inert carrier gases, and/or hydrogen are input into the vacuum tight oven/furnace either as a mixture or independently and brought up to the oven's temperature through a series of tubing coils inside the oven.

The system preferably is under constant recycling/recirculating through the duration of the process by the variable speed pumps that can be included or excluded using valves if the process requires pulsation or no recycle/recirculating pumps at any time during the process. The internal system vacuum pressure is controlled by one or more mass flow/pressure controllers upstream and downstream. On the exhaust side (downstream side) of the oven where the exhaust temperature begins to reduce just before the heavy hydrocarbons condense, variable or constant plasma is created when or if necessary by an electric arc method and the remnant hydrocarbon gases have to cross through the plasma to continue exiting, thereby reducing the heavier hydrocarbons to simpler hydrocarbons. Further plasma reactions can be performed near the oven's exhaust point to further reduce the heavy hydrocarbons to simpler hydrocarbons depending on the particular gas or gas mixture that was input.

The final exhaust gas downstream is monitored for the type and concentration of remnant hydrocarbon gases and the system can be switched via valves to monitor the gases at various points in the system plumbing for fine tuning the process and minimizing the hydrocarbon gases in the final exit of the system. During the process the mass of the sample(s) can be measured continuously using an in-situ measurement device such as a precision load cell.

A chemical vapor infiltration system for rapidly and efficiently densifying carbon fiber preforms, porous substrates and close packed particulates by pyrolitic carbon in the structures of one or more being isotropic, anisotropic, graphitic, amorphous, lonsdaleite, and diamond and mixtures of structures, is shown schematically in FIG. 1.

The parts of the system shown in FIG. 1 include:
1. roughing pump
2. turbo pump (optional)
3. 3 way valve
4. throttle valve
5. sampling port/valve
6. valves
7, 8, 9. Turbo pumps and/or scroll pumps
10. throttle valve
11. pressure measurement
12. valve
13. optional diaphragm pump/plasma chamber
14. sampling port
15. gas inlet tube
16. sample stage
17. pressure measurement
18. high voltage input for plasma
19. venturi cone and retort
20. plasma conduit
21. gas feed
22. load cell/rotary, motor
23. element power feedthrough
24. voltage input for plasma conduits (optional for high efficiency)
25. inert gas input
26. valve
27. inert gas for power feeds
28. gas sampling port
29. insulated water cooled chamber with enclosed element and electrically non-conductive retort.

The system comprises a fluid cooled chamber 29. The chamber 29 is preferably generally cylindrical. In this preferred embodiment the chamber 29 has an internal diameter of 10 inches, and a height of 16 inches. However, the chamber 29 can be scaled up or down, and the sizes of the other components, such as the power supplies, scaled accordingly. The gas flow rates would also be adjusted to optimize the process. The process can be controlled by Labview, in a scaled version of the prototype. The system is controlled by Labview, available from National Instruments.

According to a preferred embodiment of the method of this invention, a sample is loaded onto an electrically isolated sample stage/support or an in-situ electrically isolated sample balance 16 inside a reaction zone 30 defined by a venturi cone and retort 19 located within the chamber 29 of a vacuum tight oven/furnace.

Referring to FIGS. 2A and 2B, venturi cone and retort 19 may comprise a generally cylindrical body 33 and a retort lid 31. Retort lid 31 may be configured to have a Venturi effect. In various embodiments, retort lid 31 may comprise a Venturi cone. Stated differently, retort lid 31 may comprise a generally frustoconical shape.

Atmospheric gases are evacuated with a roughing vacuum pump 1 and/or turbo vacuum pump 2 to a pressure below 2 torr. Inert gas is in put at (14,25,27) to force out any remaining atmospheric gases in the reaction zone 30 of the chamber 29. The oven/furnace is heated to the desired temperature setpoint with heater 23, and the pressure is maintained below 100 torr. Inert gas is provided to the reaction zone 30 of the chamber 29 through the power feedthroughs at flows less than or equal to 150 sccm at the location of the balance. When the setpoint temperature (isothermal or gradient), is reached, dry recycling/re-circulating pumps (constant or variable speed turbo pumps and/or diaphragm pumps or both) are turned on.

The exhaust to input circuit is opened where the flow can be measured and gas analyzed at the point before the reaction gases are input and separated by a low pressure one way flow valve into the reaction gas input side (upstream side). The vacuum pressure is set to the desired level and exhausted through a flow controller such as a throttle valve at a point immediately after the first recycle/re-circulating turbo pump connected by a tee and separated by a valve that can be opened or closed at any time for the process. Different orifice sizes at the tee can be switched to reduce flow output to the throttle valve. The output passes through a secondary turbo pump right before the roughing vacuum pump. Input and control hydrocarbon reaction gases such as methane (0-100 l/min), propane (0-50 l/min), natural gas mixtures (0-150 l/min), or any desired hydrocarbon reaction gas can be introduced right after the one way flow valve on the input/upstream side. Hydrogen can be included or excluded from the process depending on the microstructure desired. The pressure is preferably maintained below 100 torr, either at a constant pressure or pulsed from a low pressure to a higher pressure never exceeding 100 torr pressure at any time.

The sample(s) can either be grounded or charged by a constant positive or negative dc voltage or ac an voltage that can be frequency varied and/or positively/negatively biased. The wall of the inner chamber/retort can be grounded, positively or negatively charged, but is isolated from the elements or the sample(s). The contact between the reaction gases and the heating elements is minimized. The Venturi effect is preferably utilized at the exhaust side of the chamber/retort to separate the phases of the reaction gas, and also at the first re-circulating turbo pump. At a point on the exhaust side before the first recycle/re-circulating pump, a bleed line is fed to a precision flow controller which bypasses the throttle valve to the primary exhaust turbo pump right before the roughing pump. When the main throttle valve is closed the precision flow controller is engaged to control the pressure. This bleed line is preferably less than 114th the diameter of the main re-circulating loop plumbing. The exhaust gas can be analyzed from the bleed line to adjust the re-circulating flow rate to optimize the process efficiency. Because the system is continuously recycled/re-circulated the main upstream flow input can be shut off simultaneously with the exhaust and re-circulated to extract most of the carbon in the hydrocarbon gases.

During the process described above an electric arc variable frequency or fixed dc corona plasma can be implemented at the Venturi point at the oven's exhaust immediately where the exhausting gas begins to condense out the heavy hydrocarbons as tars in order to break down and form simpler hydrocarbon reaction gases for the purpose of recycling/re-circulating back into the reaction chamber/retort. Further electric arc corona plasmas can be used prior to the bleed line before the first recycling/re-circulating pump. To extract any excess hydrogen on the exhaust side a magnetite filter can be used after the plasma treatment. In addition, the entire re-circulating plumbing before and after the turbine(s) can be high temperature plasma transfer lines. The re-circulating plumbing can be designed to incorporate a solenoidial electromagnet system surrounding the plasma tubing thereby enhancing the partially/fully ionized plasma and further adjust stream density and direction. The latter is the most rapid and efficient method for CVI/CVD optimization.

A controllable variable speed turbo/turbine vacuum pump with either an in-line or 90 degree exit port that can operate at vacuum pressures above 3 torr with the turbine blades made from stainless steel, CMC or other high strength, high temperature alloys or composites. Where the entrance and exit ports utilize the Venturi effect to enhance gas flow. The pumps can be air powered, electric motor powered, fluid powered, etc. with or without magnetic bearings. The higher the rpm the better as far as flow capability. No upper limit, but a lower limit of 10000 rpm is necessary for the system.

One or more constant or variable speed inline turbo pump(s) or 90 degree turbo pump(s) can be used to re-cycle/re-circulate the reaction gases not consumed in the first pass through the oven/furnace electrically isolated reaction chamber/retort and electrically isolated sample(s).

The turbines can be used without plasma circulation.

Partially or fully ionized hydrocarbon/argon/helium/hydrogen (combinations or mixtures of gases always including a hydrocarbon gas) use plasma conduits to transfer and re-circulate said gases with or without the use of a turbine to aid in the re-circulation.

A dry diaphragm pump can be used either alone or combined with one or more turbo type vacuum pump(s) to recycle/re-circulate the hydrocarbon gases in the CVI/CVD process to improve efficiency and the rate of densification or deposition.

Preferably all hydrocarbon gases (CxHy), including heavy hydrocarbons, are recycled/re-circulated and/or modified to improve the rate of densification and the efficiency of the CVI process.

An electric arc corona plasma can be used to break down heavy hydrocarbon gases by either constant or variable dc voltages and/or constant or variable frequency ac voltages that can be biased negatively or positively. For the highest efficiency, the plasma is preferably contained within the complete re-circulation circuit so that the re-circulated gases are not only dissociated, but also kept at a high temperature.

The sample(s) to be densified is preferably electrically isolated from the system and is either grounded, negatively or positively charged with dc voltage, or charged by an ac voltage which can be frequency modulated and biased positively or negatively to increase the rate of deposition and the efficiency.

The reaction chamber/retort is preferably electrically isolated from the sample(s) and the system and can be grounded, or charged with dc or ac voltages.

A turbo vacuum pump can be followed by a dry diaphragm pump or multiple turbo pumps to aid in building up a pressure higher than the reaction chamber pressure at the reaction gas entrance point to open an alternative one-way check valve directed toward the reaction chamber/retort to facilitate continuous or pulsed re-circulation.

The efficiency of the CVI process in depositing carbon is preferably greater than 5% as measured by the total mass of carbon contained in the total volume of the hydrocarbon gases used when compared to the mass gain of the preform, substrate or particulate mold.

A mold, shape, or form of particulates are densified by any CVI/CVD carbon matrix structure.

The sample(s) are preferably weighed in-situ processing in a CVI/CVD system.

The system and process can use a magnetite filter to extract hydrogen.

An electrically isolated coiled tube in or near the electrically isolated reaction chamber can be provided to preheat the incoming reaction gases and provide an electrical conduction path to charge or ground the interior walls of the electrically isolated reaction chamber.

The Venturi effect can be used to separate the phases of the hydrocarbon gases exiting a reaction chamber/retort for increasing efficiency using a plasma at the point prior to or at the heavy hydrocarbon condensation point within the ovens/furnaces exit tube.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Recirculating/recycling can occur before or after the roughing vacuum pump which can be a dry vacuum pump or a liquid vacuum pump.

After the roughing pump the effluent gas can go through a pressure swing unit to extract hydrogen before circulating back into the reactor.

What is claimed is:

1. A method of chemical vapor densification of a base material, the method comprising:
   loading the base material into a chamber of an oven;
   establishing a sub-atmospheric pressure inert gas atmosphere in the chamber;
   heating the chamber;
   introducing a hydrocarbon reaction gas into the chamber to infiltrate and densify the base material;
   withdrawing unreacted hydrocarbon reaction gas from the chamber;
   recirculating at least some of the withdrawn unreacted hydrocarbon reaction gas back into the chamber; and
   applying an electric arc to the unreacted hydrocarbon reaction gas withdrawn from the chamber to breakdown hydrocarbons of the hydrocarbon reaction gas.

2. The method according to claim 1, wherein the hydrocarbon reaction gas comprises at least one of methane, propane, or natural gas.

3. The method according to claim 1, further comprising introducing hydrogen into the chamber with the hydrocarbon reaction gas.

4. The method according to claim 1, wherein the recirculating at least some of the withdrawn unreacted hydrocarbon reaction gas comprises recirculating only part of the withdrawn unreacted hydrocarbon reaction gas back into the chamber.

5. The method according to claim 1, wherein the chamber is maintained at a pressure of about 100 Torr or less.

6. The method of claim 1, wherein the base material is a carbon fiber preform.

7. The method of claim 1, wherein the base material is a porous substrate.

8. The method according to claim 1, further comprising:
electrically isolating the base material in the chamber; and
applying an electrical voltage to the base material while the hydrocarbon reaction gas is circulating in the chamber.

9. The method according to claim 8, wherein the electrical voltage is a fixed voltage.

10. The method according to claim 8, wherein the electrical voltage is a time-varying voltage.

11. The method according to claim 1, wherein the chamber comprises a Venturi cone.

12. The method of claim 1, wherein a Venturi effect is unitized at an exhaust side of the chamber.

* * * * *